United States Patent [19]
Depue

[11] Patent Number: 5,933,019
[45] Date of Patent: Aug. 3, 1999

[54] CIRCUIT BOARD TESTING SWITCH

[76] Inventor: Clayton S. Depue, 1304 N. Meade St., Suite 11, Arlington, Va. 22209

[21] Appl. No.: 08/812,968

[22] Filed: Mar. 5, 1997

[51] Int. Cl.$^6$ .............................. G01R 31/02; G01R 31/26
[52] U.S. Cl. ......................... 324/761; 324/754; 324/419; 335/151; 335/152; 307/132 E; 361/206
[58] Field of Search ..................... 324/418, 419, 324/754, 756, 761; 307/112, 125, 132 E, 132 M; 335/151, 152, 153, 154; 361/160, 206

[56] References Cited

U.S. PATENT DOCUMENTS

| | | | |
|---|---|---|---|
| 2,982,913 | 5/1961 | Berry | 324/73 |
| 3,343,077 | 9/1967 | Brader et al. | 324/419 |
| 3,723,867 | 3/1973 | Canarutto | 324/73 PC |
| 4,092,586 | 5/1978 | Dinkler et al. | 324/419 |
| 4,714,875 | 12/1987 | Bailey et al. | 324/73 PC |
| 4,801,871 | 1/1989 | Tada et al. | 324/73 R |
| 4,857,833 | 8/1989 | Gonzalez et al. | 324/73 R |
| 4,980,526 | 12/1990 | Reneau | 335/151 X |
| 5,126,953 | 6/1992 | Berger et al. | 364/579 |
| 5,187,430 | 2/1993 | Marek et al. | 324/66 |
| 5,252,936 | 10/1993 | Norimatsu | 335/151 |
| 5,485,099 | 1/1996 | Aksu | 324/761 |

*Primary Examiner*—Glenn W. Brown
*Attorney, Agent, or Firm*—Randy W. Lacasse

[57] ABSTRACT

An electro-mechanical reed relay in-circuit test fixture switch is inserted onto a wrapped wire pin extending from the bottom of a socket holding a spring-loaded nail inside a bed-of-nails or equivalent testing fixture. The switch is located at the circuit board being tested and is connected between the pin under test and a remote testing unit. Only the switches required to contact specific nodes for a specific test are actuated, i.e. moving the subject pin's reed relay switch to a closed position, during the actual test sequence. All remaining test wires are turned off, i.e. opened, releasing the electrical connection of long test wires from each of the nodes. Alternatively, all switches can be NC and individual switches, or groups of switches, can be opened to disconnect the electrical connections of the long test wires. Additional testing is performed in a similar method by repeating the steps above for various test sequences and nodes.

17 Claims, 3 Drawing Sheets

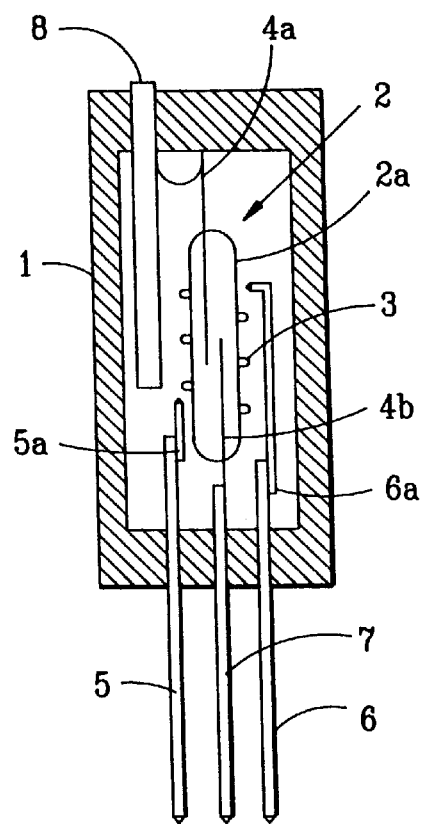
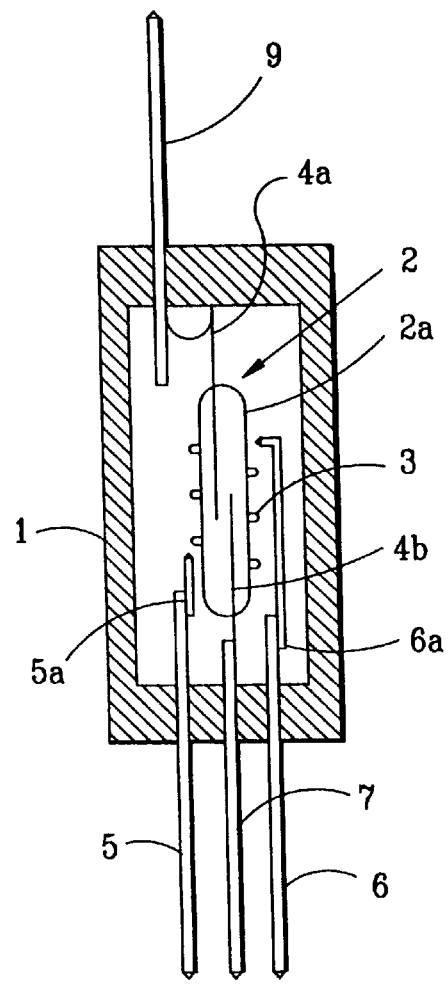
FIG. 1
FIG. 3
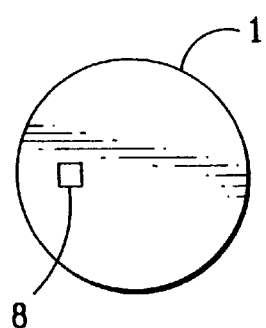
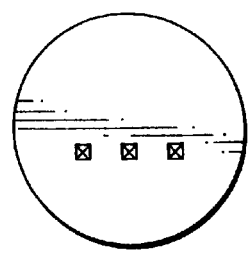
FIG. 2a
FIG. 2b

CIRCUIT BOARD TESTING SWITCH

BACKGROUND OF THE INVENTION

1. Field of Invention

The present invention relates generally to the field of circuit board testing. More specifically, the present invention is related to a method and apparatus to remove signal interference created by long wires used during testing circuit boards by systems using wrapped wire bed-of-nails fixtures.

2. Discussion of Prior Art

In-circuit and other types of testing have typically used a "bed-of-nails" to contact individual circuit traces (nodes) on the bottom and/or top of populated printed circuit boards in order to test or measure individual components or electrical functions of the board. The "nails" are spring loaded 46 pins with a sharp point 45 that contacts the circuit board 30 and typically plug into a socket receptacle 47 with a wire-wrap pin 48 on the other end. The nails are held in place by the sockets which are held in place by an insulating material 31. Each bed-of-nails fixture is unique to its respective circuit board and has anywhere from a few nails to a few thousand nails. The circuit board is brought into contact with the nails by either a vacuum that brings the board down onto the pins and compresses the springs, by a pneumatic or mechanical device that pushes the circuit board into contact with the nails, or by moving bed-of-nails that close on the circuit board from the top and/or bottom.

The wire-wrap pin of each socket receptacle is wired to various types of connector blocks 40 at the fixture receiver interface 32/33, with wires 22 that are from one to three feet in length. Another set of wires 23, also one to three feet in length, connect the connector block in the receiver 41 to the test electronics 35. The second set of wires connect first to a set of relays 36 that switch the wires, and their respective pins, to the tester electronics 35 located within the remote testing unit 20. Therefore, when the bed-of-nails fixture is in contact with the board, there is a wire connected to each circuit trace that is two to six feet in length. For many circuit boards and tests, these wires do not interfere with the testing of the board. However, high frequency circuit boards (high speed digital, wireless, CATV and other high frequency products) usually have very small value components in complex circuits making them very difficult to measure.

Lengths of wire associated with a bed-of-nails fixture are in contact with the board, making testing even more difficult. These extra lengths of wire can add capacitance and/or inductance, or act like antennas, making accurate measurements impossible. One solution has been to use a two stage fixture which first makes contact with a minimum number of pins in order to make tests on the smaller or more sensitive nodes of the circuit board. Then, a second actuation brings the board into contact with all of the nails to complete the testing. The main disadvantage of this method is that many wires are still connected to the circuit card during the first stage of testing. Also, two stage fixtures are complex and more costly.

In order to provide background information so that the invention may be completely understood and appreciated in its proper context, reference may be made to a number of prior art patents as follows:

The patent to Marek et al. (U.S. Pat. No. 5,187,430), assigned to Compaq Computer Corporation, describes a Method and Apparatus for Determining Nets Among Nodes in a Circuit Board. The circuit board 10 is the Board-Under-Test (BUT) and the relay switch box 20 connects the capacitance measuring meter 31, potential 38, current 39 and ground 40 lines to the measurement lines connected to the various reference planes of the BUT. The computer 34 properly sets relays 21 which effects the application of the appropriate stimulus (column 6, lines 55–60). The purpose of this patent is to measure or verify the number of "nets" of a bare or unstuffed or unpopulated circuit board. The "Relay Switch Box" referred to in the patent is not related to the switch of the present invention.

The patent to Berger et al. (U.S. Pat. No. 5,126,953) describes a Printed Circuit Board Assembly Tester. The switch matrix 12 is controlled by a computer 16 to cause the switch matrix to connect the "nails" of fixture 11 to a measuring instrument 20 (column 4, lines 14–16). A wire-wrap™ connection 36 connects to a "nail" in the universal grid fixture 10. The patent suggests the use of classic in-circuit test techniques using CMOS switches instead of reed relays in the switch matrix. The patent also refers to the use of a bed-of-nails fixture and wire-wrap pins, the general environment of the present invention.

The patent to Gonzalez et al. (U.S. Pat. No. 4,857,833), assigned to Teradyne, Inc., describes the Diagnosis of Faults on Circuit Board. The measurement apparatus 16 includes a relay matrix 45 which connects line 48 to line 50 to the measurement system 46. The bed of nails 14 then makes electrical contact with the BUT to perform passive voltage measurements. The patent also refers to the use of a bed-of-nails fixture, the general environment of the present invention.

The patent to Berry (U.S. Pat. No. 2,982,913), assigned to Western Electric Company, Inc., describes Test Sets. The test apparatus includes a pair of relays for each pair of corresponding terminals of the test network and the master network (column 1, lines 42–46). The high speed switching relay 23 has an operating coil 32 which is energized by power source 13. The high speed relay 23 has normally open contacts 22 until energized (column 2, lines 49–52). This patent relates to the testing of patch panels using lots of relays, the technology of the period, but fails to disclose the present invention.

The patent to Canarutto (U.S. Pat. No. 3,723,867), assigned to Ing. C. Olivetti & C., S.p.A., describes an Apparatus Having a Plurality of Multi-Position Switches for Automatically Testing Electronic Circuit Boards. The apparatus describes an electromechanical or electronic type switch 44 which extends to a measuring instrument 49. The computer selects switches 56 and 57 and connects them with selected generators 66 and 67 for stimulus. This patent offers a general description of in-circuit testing using dated technology.

The patent to Bailey et al. (U.S. Pat. No. 4,714,875), assigned to Mars, Inc., describes a Printed Circuit Board Fault Location System and the patent to Heaton et al. (U.S. Pat. No. 5,103,169), assigned to Texas Instruments Incorporated, describes a Relayless Interconnections in High Performance Signal Paths. These patents provide the teaching of using solid state switches (CMOS and FETS) in place of electromechanical switches to interface the measuring device and stimulating device to the BUT under computer control in a "Bed-of-Nails" test bed. The patent covers a classic in-circuit test system that uses a standard bed-of-nails where the present invention could be used.

The patent to Norimatsu (U.S. Pat. No. 5,252,936), assigned to Hewlett-Packard Company, describes a Reed Relay and Switch Matrix Device Using the Same. A switching operation for conduction between plural measuring devices and plural DUTs is performed with a matrix of reed relay and connecting switches. The purpose of this patent is to eliminate the leakage current associated with a reed relay to improve the measurement accuracy. The relays are contained in a matrix of relays connected by a length of wire to the device under test. The proposed invention would disconnect the length of wire, that can effect other tests, from the DUT or the fixture holding the DUT.

Whatever the precise merits, features, and advantages of the above cited references, none of them achieve or fulfill the purpose of the present invention. Accordingly, it is an object of the present invention to eliminate the inherent problems associated with long testing wires used in electronic testing systems.

It is another object of the present invention to eliminate potential antenna effects of long wires created during testing of high frequency or wireless circuit boards.

It is an additional object of the present invention to increase the accuracy of reading small value electronic components and therefore provide improved test results here before unobtainable. These and other objects are achieved by the detailed description that follows.

SUMMARY OF THE INVENTION

The present invention improves on the prior art and eliminates many problems associated with the prior art including, but not limited to, those previously discussed above. An electro-mechanical reed relay is attached to the wire wrapped socket receptacle used for in-circuit test fixture pins of a board-under-test. The switch includes male wire-wrap™ pins for connection to a remote testing unit which selectively activates the attached switches (FIG. 4). Switch configurations include, but are not limited to, normally open (NO), normally closed (NC) and combinations thereof, e.g. single-pole, double-throw (SPDT). Various implementations may be used as required by the testing configuration required for the circuit board under test.

The reed relay switch is enclosed in a plastic housing that can be inserted onto the wrapped wire pin extending from the bottom of a socket receptacle or a nail inside a bed-of-nails testing fixture. The switch is located in close proximity and/or directly under the circuit. A long wire attached at a remote end to a test system is wire-wrapped to a wire-wrapped pin on the bottom of a NO reed relay switch. Another test pin, or control pin, would be wired to one side of the reed relay's coil and the other side connected to ground.

Only the switches required to make connection to specific nodes for an analog or digital test would be actuated, i.e. pins not needed during a particular test have their attached reed relay switch in an open position during the actual test sequence. Therefore, all of the long wires normally in contact with the circuit board are electrically disconnected except for the wires or pins required for an individual test. However, it is not necessary to disconnect wires or pins which would not adversely affect the test procedure. Additional testing is performed in a similar method by repeating the steps above for various test sequences and nodes. By using the switches, only the actual pins being tested require electrical connection to the long testing wires, thereby reducing capacitance normally associated with the testing wires. By eliminating outside interferences the remote testing unit can perform low value tests which might otherwise not be possible. The use of low capacitance, low leakage, reed relay switches helps retain capacitance reductions, however functionally equivalent switches are envisioned.

BRIEF DESCRIPTION OF THE DRAWINGS

FIG. 1 illustrates a cutaway view of the reed relay switch of the present invention.

FIGS. 2a and 2b, in combination, provide for the top and bottom views of the reed relay switch as illustrated in FIG. 1.

FIG. 3 illustrates a male connector embodiment of the present invention.

DESCRIPTION OF THE PREFERRED EMBODIMENTS

Figure 4:
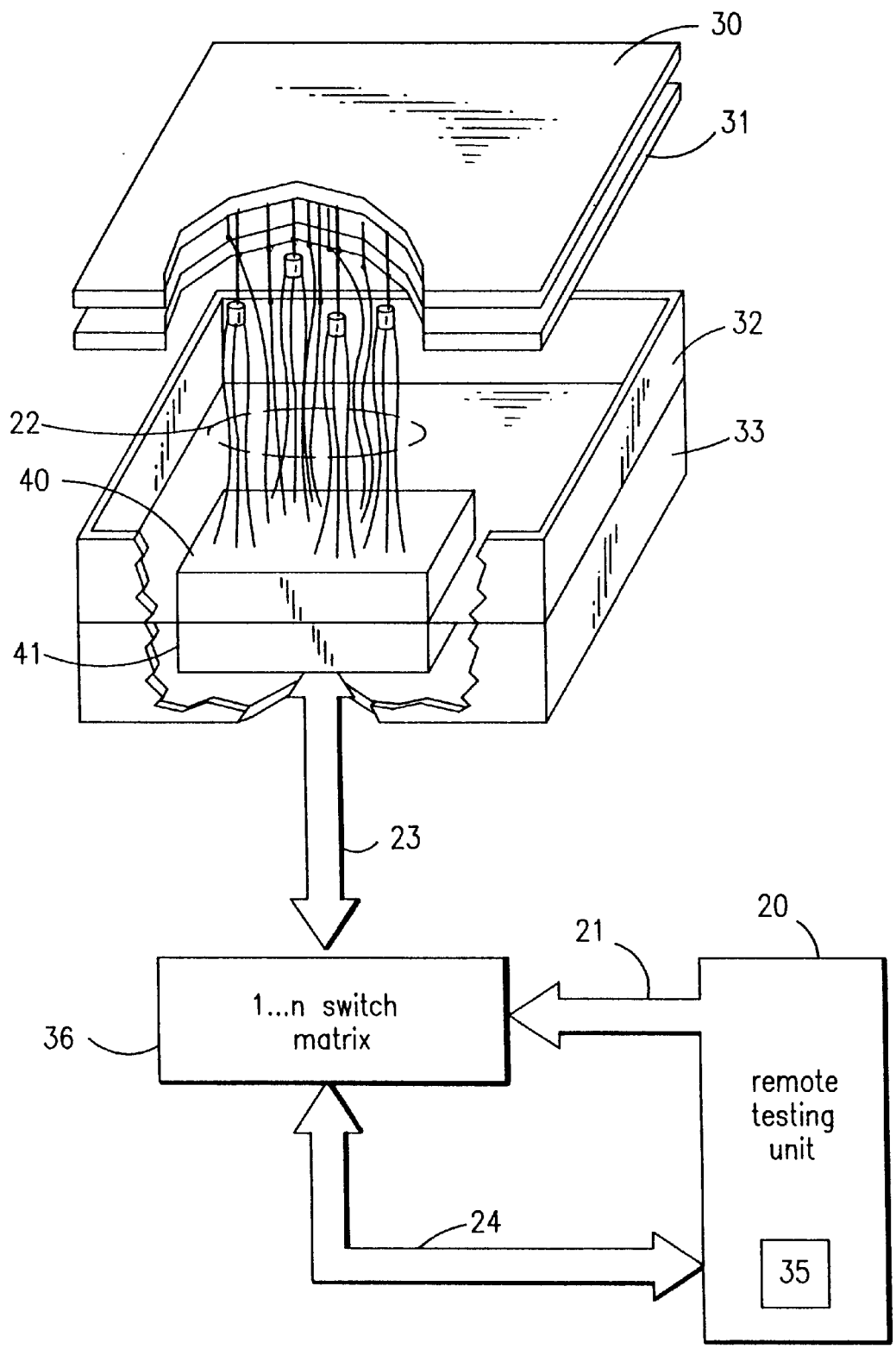
FIG. 4 illustrates the connection of the preferred embodiment switches to a board under test, fixture, receiver, switch matrix and the remote testing unit.

While this invention is illustrated and described in a preferred embodiment, the device may be produced in many different configurations, forms and materials. There is depicted in the drawings, and will herein be described in detail, a preferred embodiment of the invention, with the understanding that the present disclosure is to be considered as an exemplification of the principles of the invention and the associated functional specifications of the materials for its construction and is not intended to limit the invention to the embodiment illustrated. Those skilled in the art will envision many other possible variations within the scope of the present invention.

FIG. 1 illustrates a plastic case 1 encapsulating a reed relay switch 2. The plastic case 1 is round in the cross-sectional area of the preferred embodiment. Other implementations are envisioned without departing from the functionality and scope of the present invention. The plastic case 1 is approximately ½ inch by 1½ inches in diameter/length, but should not be limited thereto.

Reed relay switch 2 comprises a glass sealed tube 2a encapsulating a gas such as nitrogen and further includes a coil 3 which, when energized, closes normally open (NO) switch wires 4a and 4b. In the normally open (NO) configuration, shown in FIG. 1, wires 4a and 4b are not connected at initialization but are closed when coil 3 is energized. The switch could also be used in the opposite configuration, wherein all switches are normally closed (NC) and are selectively actuated to the open position to electrically disconnect the testing wires.

Figure 5:
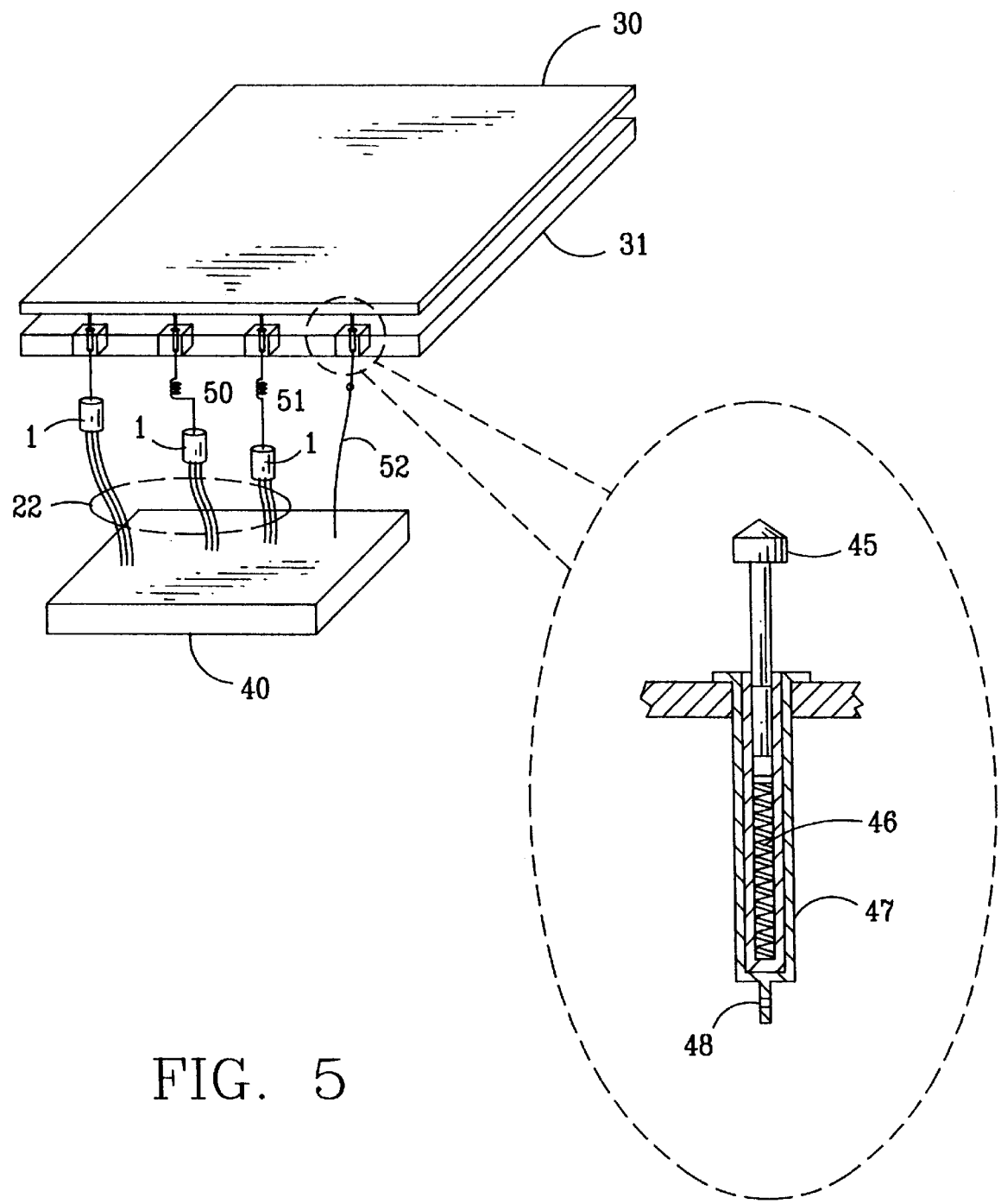
FIG. 5 illustrates various wiring configurations as well as a detail of the wire wrapped sockets.

Coil 3 is attached to power and ground by welded attachment (5a and 6a) to wrapped wire pins 5 and 6, respectively. Pin 5 is powered by control signals received through a switch matrix 36 from a remote testing unit test system 20 and associated control wires 21 and 24 thereby energizing coil 3 for closing/opening of switch wires 4a/4b. A third pin 7 is welded to 4b and, when connected to 4a, provides testing signals bidirectionally to/from the testing unit lines 22, 23 and 24 and the wrapped wire pin contacting the circuit board. A specific wrapped wire pin, designated as not to be connected to the circuit board during some tests, receives the reed relay switch unit by plugged connection to the female wrapped wire socket 8. The long testing wires are then attached to the wrapped wire pin 7 and the switch is selectively actuated by the remote testing unit to remove unneeded testing wire capacitances. Wires which do not interfere with testing may alternatively be directly wired without a switch included, see FIG. 5, element 52. An example of a commonly used remote testing unit is the HP 3070 series in-circuit test systems. Equivalent test units may be substituted.

Testing signals are selectively sent through each of the remaining connected long wires which do not have "open position" reed relay switches. The present invention is particularly adapted for, but is not limited to, testing of circuit boards using high frequency signals. Other adaptations include applications using two or more signals (may be multiplexed), monitoring signals, test pin isolation signals, stimulus signals or other conventional testing signals. Test pin isolation provides an environment conducive to engineering changes.

In a first alternate embodiment, the reed relay switch is implemented in a single-throw double pole configuration (not shown). In this embodiment, the switch can be connected in a NO, NC or off position. The single-throw double pole configuration increases the test set possible states, thereby increasing flexibility.

Often, the density of nails in the fixture prevents the use of the embodiment as shown in FIG. 4. Therefore, in a second alternate embodiment shown in FIG. 3, the reed relay switch may be modified such that a male pin 9 replaces the female wrapped wire socket 8 enabling the switch to be spliced in-line, possibly staggered with other switches (lines 50 and 51), by a technician using wrapped wire technology.

CONCLUSION

A system and method has been shown in the above embodiments for the effective implementation of a circuit board testing switch. While various preferred embodiments have been shown and described, it will be understood that there is no intent to limit the invention by such disclosure, but rather, it is intended to cover all modifications and alternate constructions falling within the spirit and scope of the invention as defined in the appended claims. For example, the present invention should not be limited by size, switch type or connection configuration.

In addition, a single board or group of switches could replace each of the individual switches of the present invention using known circuit board techniques.

I claim:

1. A testing system including a switching apparatus which selectively disconnects wires from a board-under-test comprising:
   a board-under-test;
   a bed-of-nails unit having a plurality of first and second pins extending therefrom, wherein said first pins contact various points along a planar section of said board-under-test and said second pins comprise wrapped-wire pins;
   one or more switching elements each comprising a pin receiving section, receiving one of said second pins;
   a switch, internal to each of said one or more switching elements, and operatively connected to said pin receiving section, selectable between at least a normally closed or normally open position;
   a coil encapsulating said switch, selectively actuating opening or closing thereof;
   a third and fourth pin extending from said coil;
   a fifth pin extending from said switch;
   a remote testing unit providing power to said third and fourth pins, said remote unit also connected to said fifth pin by testing wires, and
   wherein said remote testing unit selectively removes an electrical connection of pins not under test by sending coil actuation signals to said third and fourth pins.

2. A testing as per claim 1, wherein said switch comprises a single-throw double-pole switch.

3. A testing system as per claim 1, wherein said board-under-test includes high frequency circuit boards.

4. A testing system as per claim 1, wherein said switch comprises a reed relay switch.

5. A testing system as per claim 1, wherein said pin receiving section is replaced by a male pin.

6. A testing system as per claim 5, wherein said switching elements are positioned at variable vertical displacements based on the proximity of a plurality of said one or more switching elements.

7. A switching system which selectively disconnects a testing wire electrical connection of a unit-under-test comprising:
   a test pin section connected to a first end of a switching apparatus;
   a reed relay switch, internal to said switching apparatus, selectable between at least a normally closed or normally open position;
   said feed relay switch comprising a coil, selectively connected to actuation signals from a remote testing unit;
   a first, second and third wrapped wire pin extending from a second end of said switching apparatus, said first and second wrapped wire pins connecting the ends of said coil to said remote testing unit, said third pin connecting said remote testing unit signals to said test pin section, and
   wherein said remote testing unit selectively removes electrical connections of unused pins under test by sending coil actuation signals to said first and second wrapped wire pins thereby activating said reed relay switch.

8. The switching system of claim 7, wherein said remote test unit sends/receives high frequency test signals.

9. The switching system of claim 7, wherein said reed relay switch comprises a single-throw double-pole switch.

10. The switching system of claim 7, wherein said unit-under-test receives multiplexed test signals.

11. The switching system of claim 7, wherein said first end of said a male pin.

12. The switching system of claim 11, wherein said switching apparatus is positioned at variable vertical displacements based on proximity of a plurality of switching apparatuses.

13. A method of selectively disconnecting a testing wire electrical connection of a board-under-test to decrease capacitance created by said testing wires during circuit board testing, said circuit board connected to a bed-of-nails testing unit comprising:
   physically connecting one or more remotely controlled switches between one or more bed-of-nails wire-wrapped test pins and a connector block;
   connecting said connector block to a remote computer controlled testing unit;
   activating said one or more remotely controlled switches by sending power signals thereto from said remote computer controlled testing unit, through said connector block, and
   wherein said power signals are selectively sent to open switches to disconnect testing wires that interfere with other tests on said circuit board.

14. A method of selectively disconnecting a testing wire electrical connection of a board-under-test of claim 13, wherein said one or more switch comprise(s) a single-throw double-pole switch.

15. A method of selectively disconnecting a testing wire electrical connection of a board-under-test of claim 13, wherein said unit-under-test includes high frequency circuit boards.

16. A method of selectively disconnecting a testing wire electrical connection of a board-under-test of claim 13, wherein said switch comprises a reed relay switch.

17. A method of selectively disconnecting a testing wire electrical connection of a board-under-test of claim 13, wherein said method further includes wire-wrapping said switches with various lengths of wire to stagger the proximity of a plurality of said switches.

* * * * *

UNITED STATES PATENT AND TRADEMARK OFFICE
CERTIFICATE OF CORRECTION

PATENT NO. : 5,933,019
DATED : August 3, 1999
INVENTOR(S) : Clayton S. Depue

It is certified that error appears in the above-identified patent and that said Letters Patent is hereby corrected as shown below:

Column 2, line 4, change U.S. Patent Number from "5,485,099" to --5,485,096--.

Column 5, line 66, after "testing" insert --system--.

Column 6, line 19, after "said" change "feed" to --reed--.

Column 6, line 19, after "coil" delete --,--.

Column 6, line 39, after "of said" insert --switching apparatus includes--.

Column 6, line 62, after "more" change "switch" to --switches each--.

Signed and Sealed this

Thirteenth Day of June, 2000

Q. TODD DICKINSON

*Attest:*

*Attesting Officer*         *Director of Patents and Trademarks*